(12) United States Patent
Doyle

(10) Patent No.: US 7,907,760 B2
(45) Date of Patent: Mar. 15, 2011

(54) SINGLE COIL PARALLEL IMAGING

(75) Inventor: Mark Doyle, Wexford, PA (US)

(73) Assignee: Allegheny-Singer Research Institute, Pittsburgh, PA (US)

( * ) Notice: Subject to any disclaimer, the term of this patent is extended or adjusted under 35 U.S.C. 154(b) by 1041 days.

(21) Appl. No.: 11/715,755

(22) Filed: Mar. 8, 2007

(65) Prior Publication Data

US 2008/0218506 A1    Sep. 11, 2008

(51) Int. Cl.
*G06K 9/00*    (2006.01)
(52) U.S. Cl. .......... 382/128; 382/131; 382/299; 324/307; 324/309
(58) Field of Classification Search .................. 382/128, 382/131, 299; 324/307, 309
See application file for complete search history.

(56) References Cited

U.S. PATENT DOCUMENTS

| | | | | |
|---|---|---|---|---|
| 5,910,728 A | * | 6/1999 | Sodickson | 324/309 |
| 6,771,067 B2 | * | 8/2004 | Kellman et al. | 324/307 |
| 6,975,115 B1 | * | 12/2005 | Fujita et al. | 324/318 |
| 7,486,074 B2 | * | 2/2009 | McKenzie et al. | 324/309 |
| 2008/0175458 A1 | * | 7/2008 | Guo et al. | 382/131 |

* cited by examiner

Primary Examiner — Tom Y Lu
(74) Attorney, Agent, or Firm — Pepper Hamilton LLP

(57) ABSTRACT

An imaging apparatus for an object in change includes an MRI system having a computer, a first channel and at least a second channel which produce corresponding images of the object in change. The computer combining the individual images into a composite image of the object. Alternatively, the MRI system has at least a first channel which produce an image of the object in change from data acquired in k-space domain in a density of at least ⅔ that required to satisfy a Nyquist criteria. A method for imaging an object in change includes the steps of producing an individual image of the object in change with a first channel of an MRI system. There is the step of producing an individual image of the object in change with at least a second channel of the MRI system independent of the first channel. There is the step of combining the individual images into a composite image of the object with a computer of the MRI system.

12 Claims, 8 Drawing Sheets

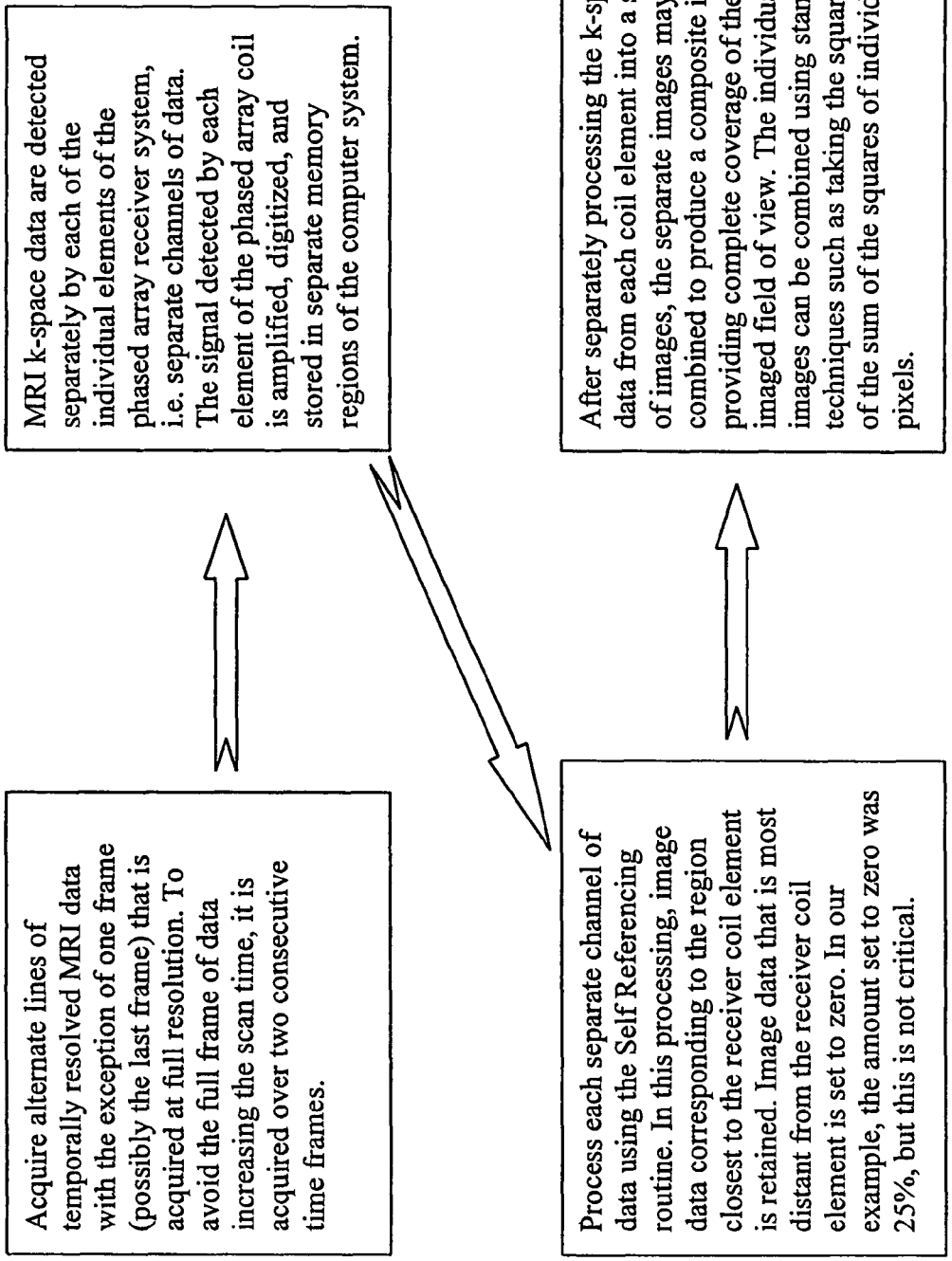

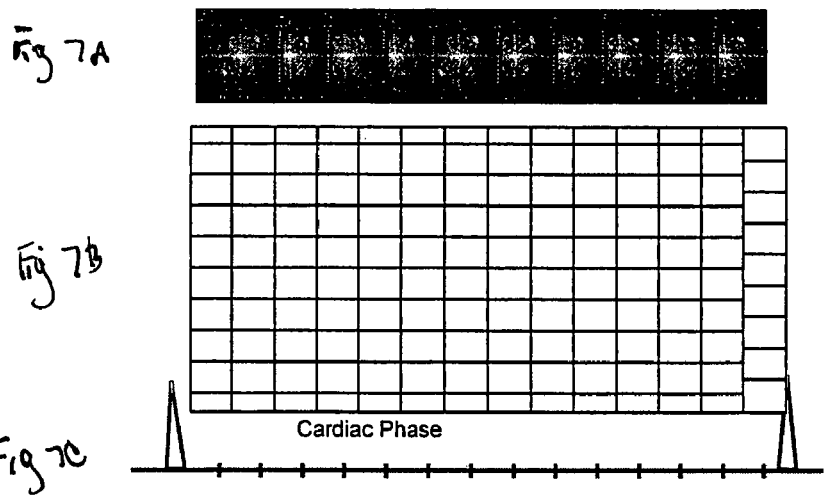
Fig 7A
Fig 7B
Fig 7C
Cardiac Phase
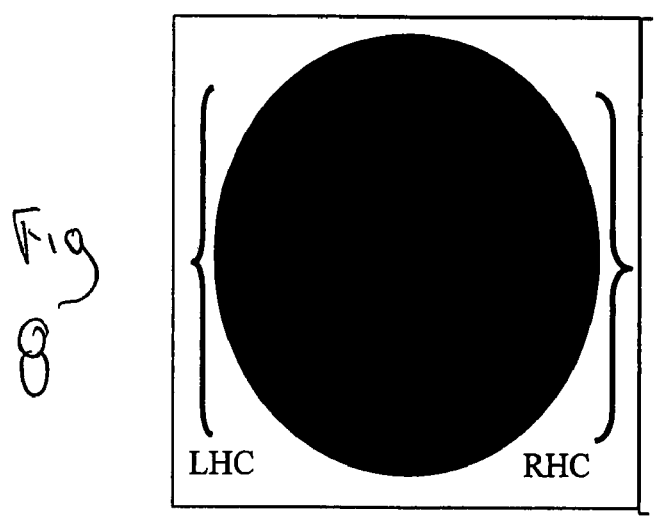
Fig 8
LHC    RHC

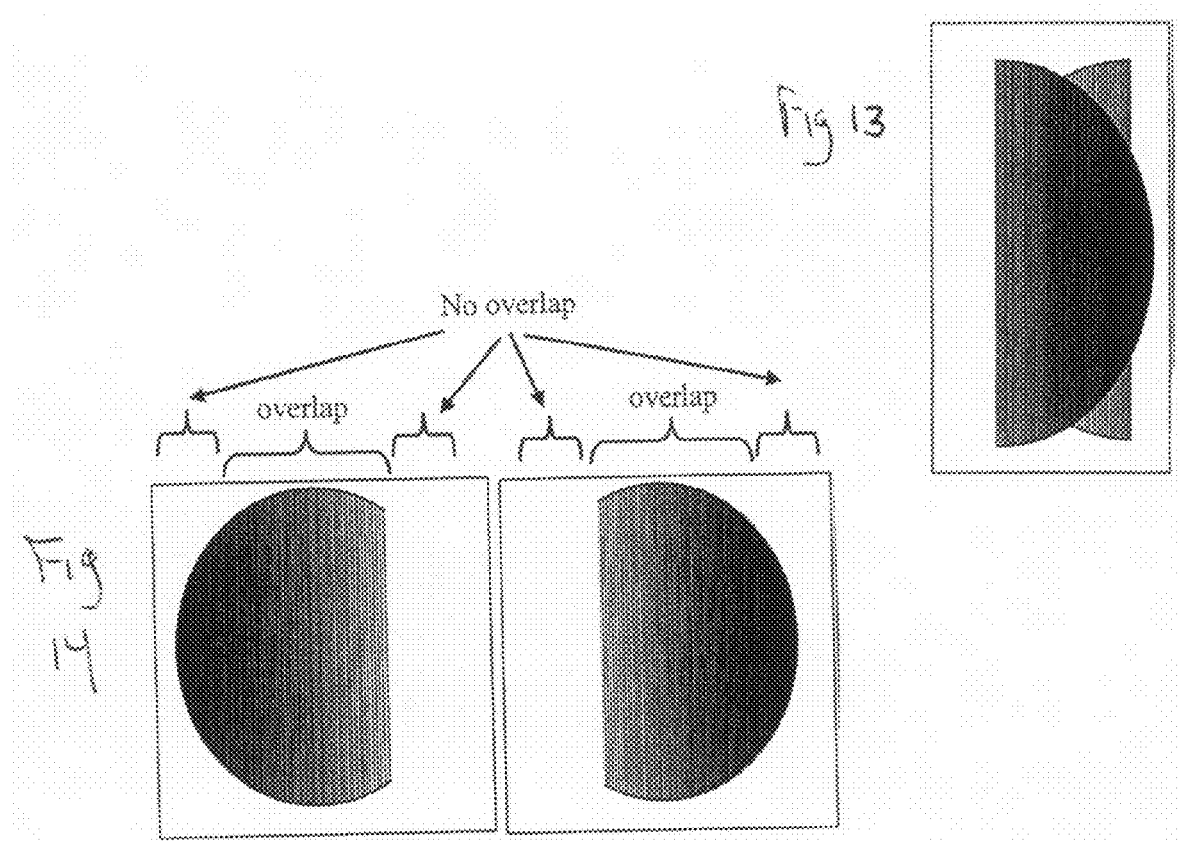
Fig 13
Fig 14
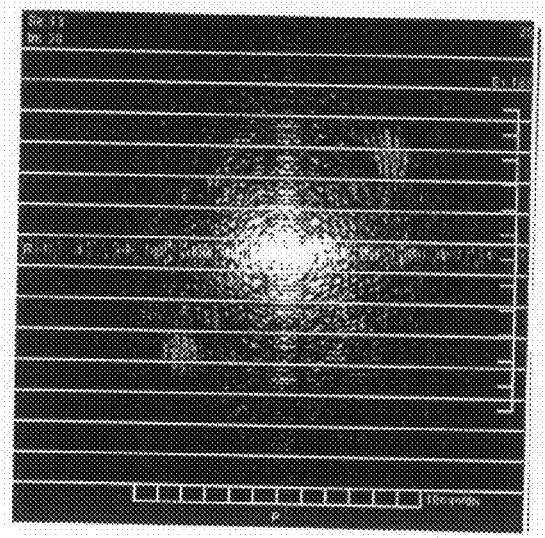
Fig 15

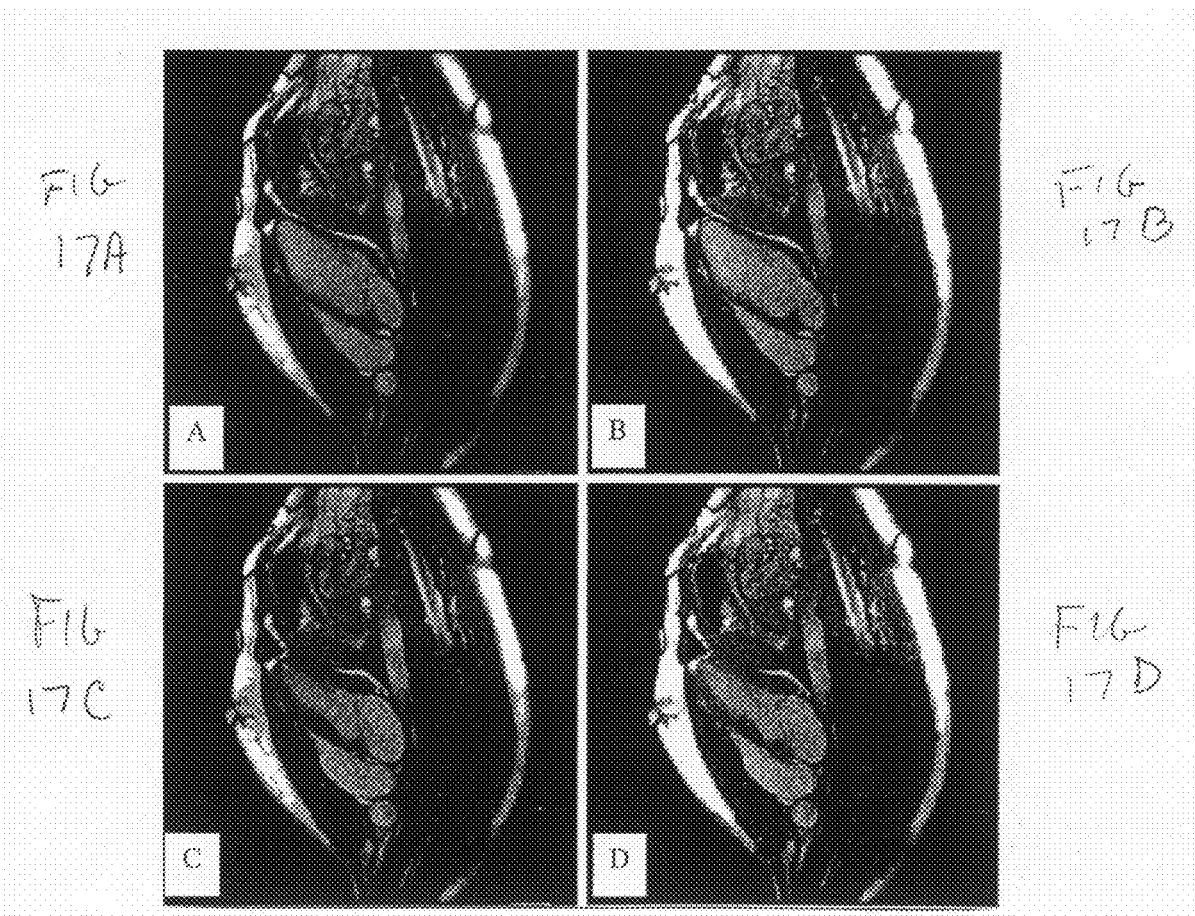

SINGLE COIL PARALLEL IMAGING

FIELD OF THE INVENTION

The present invention is related to the imaging of an object in change using an MRI. More specifically, the present invention is related to the imaging of an object in change using an MRI with a single coil element by itself or independent of other single coil elements of the MRI which produce corresponding images that are combined to form a composite image of the object.

BACKGROUND OF THE INVENTION

There are two imaging technologies, 1) Reduced field of View Imaging and 2) Parallel Imaging, which go under several names, the two most fundamental are SENSE and SMASH. When a factor of two in time reduction is required, all of the above approaches use the same k-space sampling pattern, i.e. every other line of k-space is sampled.

The Reduced Field of View approach assumes that only a part of the field of view is dynamic, and that the fold over information can be removed by subtracting that information from a previously acquired fully resolved image.

The SMASH and SENSE approaches are related in that they use the sensitivity profiles of separate receiver coils to remove the folded over data. They rely on using two or more receiver coils, each with a distinctly different sensitivity profile to the body section being imaged. Essentially, the folded over data are removed for images in pairs (or higher combinations) of coils with each image pair having different sensitivity characteristics as determined by the coils. The SMASH approach performs this disentangling operation in the k-space domain, while the SENSE approach, performs this operation in the image domain.

BRIEF SUMMARY OF THE INVENTION

The present invention pertains to an imaging apparatus for an object in change. The apparatus comprises an MRI system having a computer, a first channel and at least a second channel which produce corresponding images of the object in change, preferably using alternate lines of k-space. The computer combining the individual images into a composite image of the object. The MRI system acquiring alternate lines of temporally resolved data.

The present invention pertains to an imaging apparatus for an object in change. The apparatus comprises an MRI system having a computer, and at least a first channel which produce an image of the object in change from data acquired in k-space domain in a density of at least ½ that required to satisfy a Nyquist criteria.

The present invention pertains to a method for imaging an object in change. The method comprises the steps of producing an individual image of the object in change with a first channel of an MRI system, preferably using alternate lines of k-space. There is the step of producing an individual image of the object in change with at least a second channel of the MRI system independent of the first channel by acquiring alternate lines of temporally resolved data, preferably using alternate lines of k-space. There is the step of combining the individual images into a composite image of the object with a computer of the MRI system.

BRIEF DESCRIPTION OF THE SEVERAL VIEWS OF THE DRAWING

In the accompanying drawings, the preferred embodiment of the invention and preferred methods of practicing the invention are illustrated in which:

FIG. 1 shows a fully resolved k-space data set.

FIG. 6 is a block diagram of a self-referencing process.

FIG. 7A represents the fully sampled k-space series.

FIG. 7B represents how the sparsely sampled k-space matrix data are acquired at each point in the cardiac cycle.

FIG. 7C shows where images are to be represented throughout the cardiac cycle.

FIG. 8 shows the last two frames of the acquired k-space data are combined such that the even and odd lines of k-space are correctly positioned in the matrix.

FIG. 13 shows a separate folded over image is available from each coil element.

FIG. 14 shows, for opposite coil elements, the unfolded images have opposite edges set to zero.

FIG. 15 shows a schematic of the density of sampling of k-space lines that satisfy the Nyquist sampling criteria.

FIGS. 17A-17D show a simulation of single coil parallel imaging (17A and 17C) and corresponding single coil parallel images (17B and 17D).

FIG. 18 shows a typical cardiovascular image featuring the heart.

DETAILED DESCRIPTION OF THE INVENTION

Figure 16:
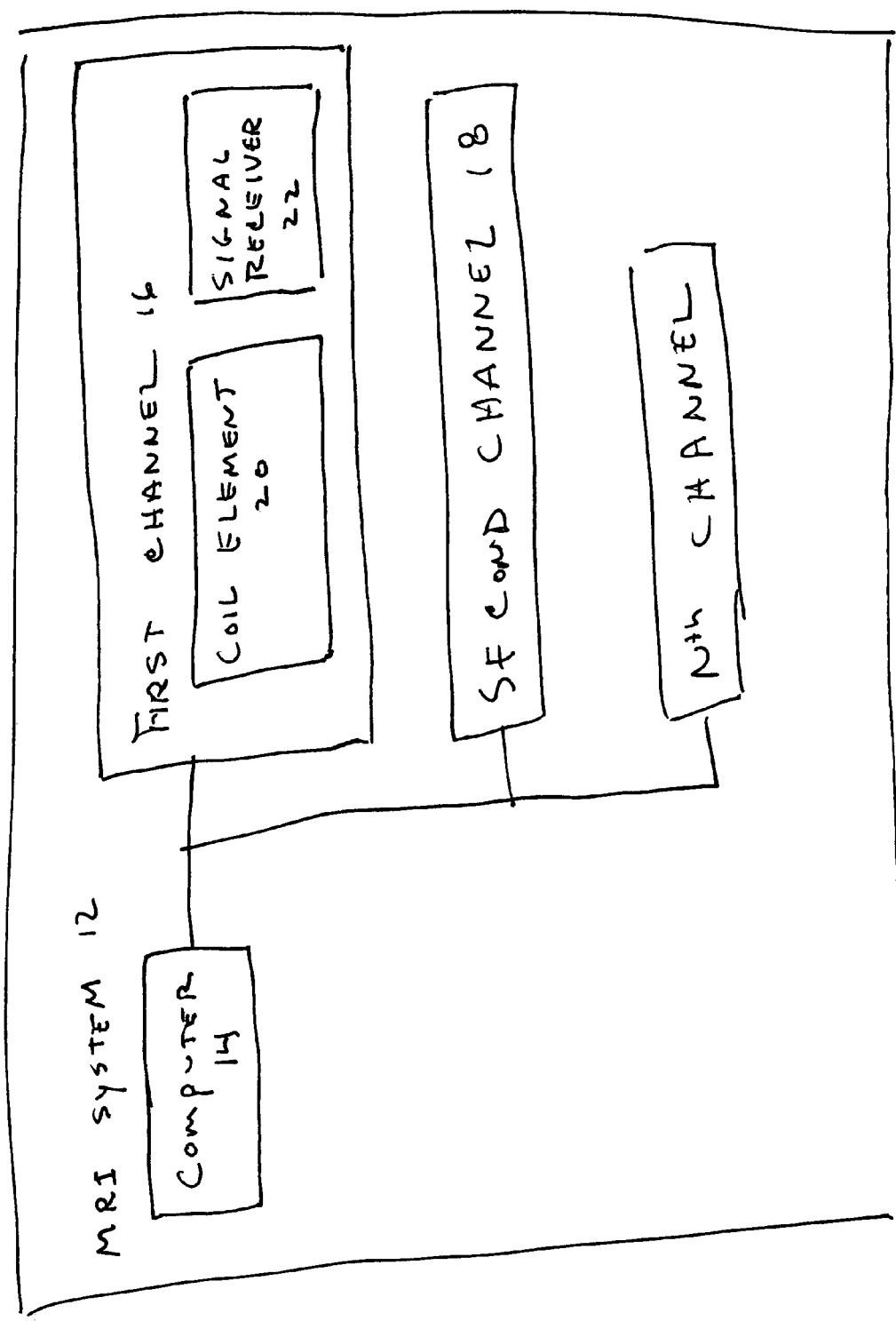
FIG. 16 is a block diagram of the imaging apparatus of the present invention.
Figure 10:
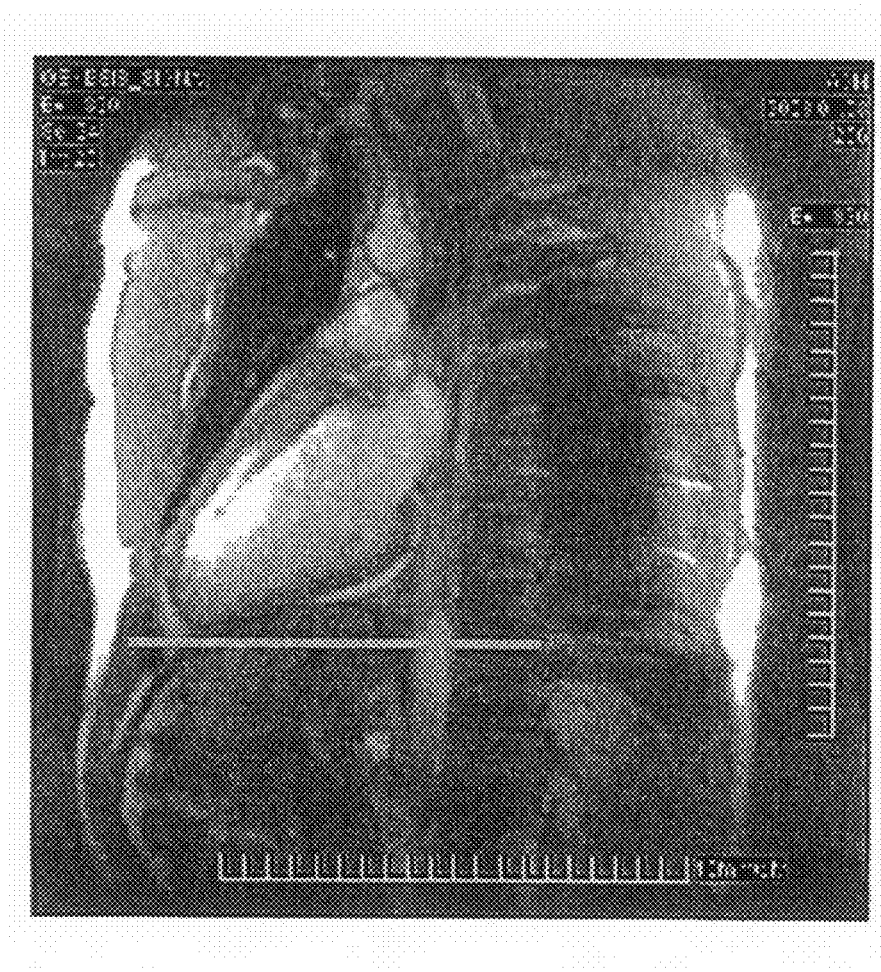

Referring now to the drawings wherein like reference numerals refer to similar or identical parts throughout the several views, and more specifically to FIG. 16 thereof, there is shown an imaging apparatus 10 for an object in change. The apparatus 10 comprises an MRI system 12 having a computer 14, a first channel 16 and at least a second channel 18 which produce corresponding images of the object in change, preferably using alternate lines of k-space. The computer 14 combining the individual images into a composite image of the object. The MRI system acquiring alternate lines of temporally resolved data.

The MRI system 12 preferably requires at least one frame of temporally resolved data at full resolution. Preferably, each channel includes a coil element 20 and a signal receiver 22, for each channel, retains image data corresponding to a region closest to the coil element 20, the region including at least 50% of the data. The at least one frame of temporally resolved data at full resolution is preferably acquired over two time frames, which may be consecutive or temporally distributed.

Preferably, the individual image from each coil is imaged at different intensities to form a fully resolved image. The computer 14 preferably forms a ratio map for each coil separately using the corresponding fully resolved image. Preferably, the ratio map for an individual channel corresponds to an intensity ratio of pixels that would overlap in an approximately 50% folded over image. The computer 14 preferably uses the ratio map to distribute pixel intensity between a first pixel closest to the coil and a second pixel more remote to the coil than the first pixel.

Preferably, the composite pixel is split between two unfolded pixel positions according to the formula $$\text{closest pixel intensity} = R \times C/(R+1)$$

where R is the ratio value and C is the observed intensity in the folded over image, and $$\text{furthest pixel intensity} = C - \text{closest pixel intensity}.$$

The computer 14 preferably forms the composite image by setting pixels of the individual image of the first channel 16 with no overlap with the individual image of the second channel 18 to the value of the pixel of the first individual image. Preferably, the computer 14 forms the composite image with composite pixels with non-zero values of the individual images that overlap equal to the square root of the sum of the squares of the individual pixels which overlap.

The present invention pertains to an imaging apparatus 10 for an object in change. The apparatus 10 comprises an MRI system 12 having a computer 14, and at least a first channel 16 which produce an image of the object in change from data acquired in k-space domain in a density of at least ⅔ and preferably at least ½ that required to satisfy the Nyquist criteria.

The present invention pertains to a method for imaging an object in change. The method comprises the steps of producing an individual image of the object in change with a first channel 16 of an MRI system 12, preferably using alternate lines of k-space. There is the step of producing an individual image of the object in change with at least a second channel 18 of the MRI system 12 independent of the first channel 16 by acquiring alternate lines of temporally resolved data, preferably using alternate lines of k-space. There is the step of combining the individual images into a composite image of the object with a computer 14 of the MRI system 12.

Preferably, the producing the individual image of the object in change with the first channel 16 step includes the step of acquiring alternate lines of temporally resolved data. The producing the individual image of the object in change with the first channel 16 step preferably includes the step of acquiring at least one frame of temporally resolved data at full resolution. Preferably, each channel includes a coil element 20 and a signal receiver 22, and there is the step of retaining image data corresponding to a region closest to the coil element 20, the region including at least 50% of the data, for each channel.

The step of acquiring at least one frame of temporally resolved data at full resolution step preferably includes the step of acquiring at least one frame of temporally resolved data at full resolution over two time frames, which may be consecutive or temporally distributed. Preferably, the producing the individual image of the object in change with the first channel 16 step includes the step of imaging the individual image with the coil element 20 at different intensities. There is preferably the step of forming a ratio map for each coil separately using the corresponding fully resolved image with the computer 14. Preferably, the ratio map forming step includes the stop of forming the ratio map for an individual channel corresponding to an intensity ratio of pixels that would overlap in an approximately 50% folded over image.

In the operation of the invention, the key features of the single coil parallel imaging scheme are:

1. The sampling pattern of obtaining alternate lines of k-space is commonly used in the so-called parallel imaging approaches. The unique feature here is that the approach only requires a single coil to work. Whereas parallel imaging requires multiple coils to be used simultaneously.
2. In parallel imaging, the signal to noise that is ultimately realized is dependant on the detailed manner in which multiple coils interact. This is characterized by the so-called G factor (goodness factor). A G-factor of 1 indicates that the coils and signal processing perform optimally, and typically values of 1.2 and higher are achieved, indicating that less than optimal image signal to noise ratio is achieved. In the current invention, the ratio map of each coil element 20 from one half to the other is used to remove fold over artifact. In a strict sense, this can only be done in an approximate manner, while the parallel imaging approaches can unambiguously assign correct pixel values. Given this, it may seem that the current invention performs poorly compared to parallel imaging, and would not have any further value. However, in practice, the G-factors, and other implementation errors significantly degrade parallel images, such that artifacts and noise level are noticeably elevated. The current invention has the advantage that noise propagation is low and, in practice, artifact levels are almost indiscernible, giving the approach a practical advantage over parallel approaches.
3. The Reduced Field of View approach uses a similar argument as the current invention to restrict the field of view of the dynamic image portion to 50% of the image width. Typically, this region is assumed to be contiguous. Whereas, in this invention, this restriction does not apply.
4. The Reduced Field of View approach essentially treats the static data portion of the image as a region that has to be subtracted out of the "folded over image". The data subtraction process is responsible for dramatically increasing noise levels in the final image. In the current invention, overlapping signals are "separated" from dynamic tissue by a multiplication operation (the ratio operation), making the noise contribution minimal. This is a key advantage of the current invention.
5. The Reduced Field of View approach essentially has to identify which regions are static and which are dynamic, and the static region then is represented with no temporal changes. Thus, 50% of the image space is static in these approaches, leading to an artificially static image with a dynamic portion embedded in it. In the current invention, each frame has the freedom to represent the dynamic data wherever it should appear, and thus there are no artificially static appearing regions, with each pixel typically having some dynamic content in each frame.

The apparatus 10 is an MRI approach to produce dynamic images in a reduced scan time by exploiting the signal intensity profile of an individual coil element 20 of a phased array receiver coil set (the apparatus 10 can work for a single coil or multiple coils). The MRI signal data is termed k-space. The apparatus 10 samples every other line of k-space for most frames of the dynamic series. Additionally, one k-space frame of the series is sampled in its entirety. This can be accomplished by combining data obtained from two or more suitably sampled k-space data sets. The technique requires two commonly met conditions: 1) the intensity of the received signal falls off with distance into the body (this signal characteristic is normally present for each separate element of a typical receiver coil system), and 2) the dynamic feature being imaged occupies approximately 50% of the field of view (this is typically met for cardiac and other imaging situations, although this condition does not have to be rigorously met).

Figure 3:
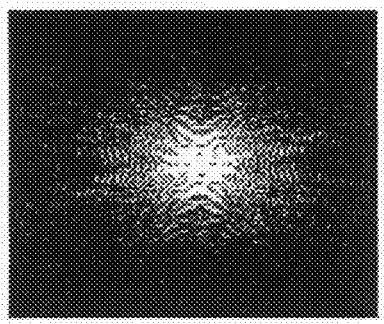
FIG. 3 shows a k-space data set with every other line omitted, i.e. a half data set.
Figure 2:
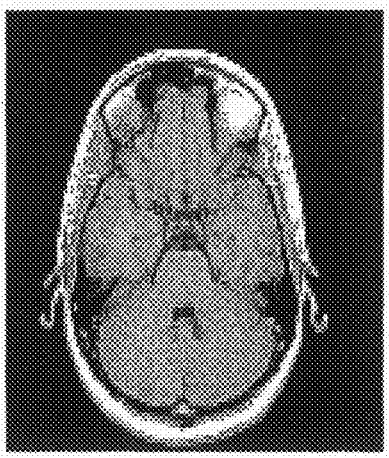
FIG. 2 shows the corresponding MR image generated from the k-space data set of FIG. 1.
Figure 4:
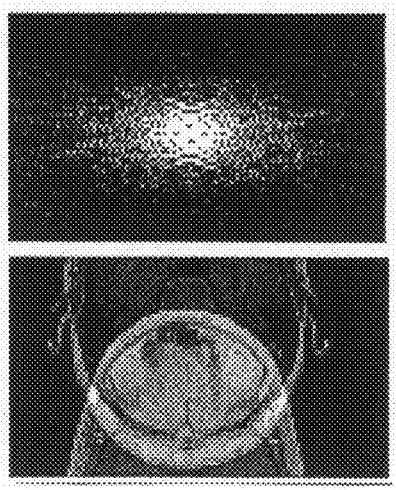
FIG. 4 shows the corresponding MR image generated from the k-space data set shown in FIG. 3, illustrating a half image fold over artifact.
Figure 5:
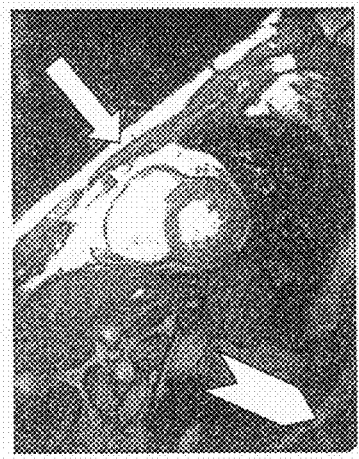
FIG. 5 shows one frame of a cardiac image series seen using only one coil element.

When every line of the k-space data are acquired, the data set is said to be fully sampled, i.e. it satisfies the Nyquist sampling criteria (see below), and the corresponding image generated from it is correctly resolved. FIG. 1 shows a fully resolved k-space data set. The corresponding MR image generated from this is shown in FIG. 2. When every other line of k-space is omitted (reducing the scan time by a factor of 2) the corresponding image is equivalent to superimposing two halves of the original image. FIG. 3 shows a k-space data set with every other line omitted, i.e. a half data set. The corresponding MR image generated from this is shown in FIG. 4, illustrating a half image fold over artifact. It is noted that the final image is derived from a series of separate receiver coil elements 20 (typically 4, 8 or 16). For each receiver coil element 20 each part of the image is seen with different intensity, depending on how close it is to the receiver coil. FIG. 5 shows one frame of a cardiac image series seen using only one coil element 20. In this case, the signal is most intense at the chest wall (arrow), and falls off dramatically towards the back of the subject (chevron). Note also, that typically, for any given line of the image, the dynamic information typically occupies less than 50% of that line. FIG. 18 shows a typical cardiovascular image featuring the heart. In this case, the line represents a region of the image, which corresponds to half of the field of view. This half of the field of view contains the bulk of the image features that exhibit motion, or dynamic changes, from frame to frame. The apparatus 10 utilizes these separate observations in the following way:

For one frame of a dynamic series, all of the k-space lines are acquired, and a fully resolved image is obtained, FIGS. 1 and 2.

From this fully resolved image, the ratio of the first half of the image to the second half is obtained separately or each coil element 20. The orientation of which image half to use is determined by the "phase encoding" direction used in the MRI sequence.

For every other dynamic time point (e.g. time through the cardiac cycle), k-space data sets are acquired by omitting every alternate line. The images produced by these data sets are folded over by 50%, FIGS. 3 and 4.

When considered for each coil element 20, there are a series of folded over images.

For each coil element 20, the ratio map is used to disentangle the series of time resolved folded over images using the following formula:

The ratio map is used to multiply the folded over image to determine the relative amount of signal to assign to the un-folded over image pixels. For each 50% overlap pixel, the larger ratio is assigned to the corresponding pixel closest to the coil and the lower portion is assigned to the corresponding pixel furthest from the coil.

The above algorithm distributes the pixels based on the ratio map and the folded over data obtained from a single coil element.

Since the more distant regions from the coil have low signal to noise ratio, these pixels are typically not well represented by this scheme, since they are very noisy. Conversely, pixels closest to the coil element 20 are typically well represented by this scheme.

To best represent the pixels, 25% of each line furthest from the receiver coil is set to zero, due to the potential for high artifact in this region.

To form the final image, the series of partial and folded out images from the series of coil elements can be combined by signal averaging. Since the series of coil elements cover the entire slice, the resultant image closely resembles the image that would have been acquired from the fully acquired k-space data set. FIGS. 17A-17D show a simulation of Single Coil Parallel Imaging, showing original frames (17A and 17C) and corresponding Single Coil Parallel Images (17B and 17D). 17A and 17B correspond to early systole and 17C and 17D correspond to late systole.

The k-space data can be acquired in a number of variations for this approach, and one example is given here: the reduced k-space data sets are acquired throughout systole and for most of diastole (for a cardiac series). The single reference frame requiring a full k-space acquisition is acquired at end-diastole spanning two acquisition time slots, when the heart exhibits the least motion.

The apparatus 10 can be used in MR scanners to reduce the scan time for cardiac imaging, or for any imaging sequence that requires dynamic data, examples include: time resolved magnetic resonance angiography, real-time approaches to monitor interventions and procedures, and time resolved imaging to observe the kinetics of a contrast agent.

The approach herein can be interpreted as a hybrid between parallel imaging and Reduced Field of View approaches. It incorporates many of the key advantages of the other two classes of rapid imaging approach without suffering many of the key disadvantages. Of note is that data for each of three rapid imaging approaches: 1) Reduced Field of View, 2) parallel imaging, 3) and the current invention, are acquired with very similar k-space sampling strategies where alternate lines of k-space are sampled. Thus, the key feature distinguishing them is related to the image processing routine used to produce the final image, which in turn is governed by the physical principle being exploited. To best appreciate the advantages of the current invention, it is convenient to consider that conventionally, the image reconstructed from sampling alternate lines of k-space is presented as a folded-over image, i.e. one contiguous half of the image is folded over onto the opposing half. The operation of the processing algorithm then is to unfold the image. Further, in approaches that acquire a reduced number of lines of the MRI k-space data, the signal to noise ratio (SNR) is decrease compared to the image that would have been obtained from a full k-space matrix. In a theoretically ideal system, the SNR of the reduced acquisition is given by:

$$SNR(\text{reduced scan}) = SNR(\text{full scan})/\sqrt{(R)}$$

Where R is the sparse sampling factor, e.g. if half the lines are sampled, R=2.

Existing parallel imaging approaches, such as SMASH and SENSE, require the processing of two or more channels of data, and typically introduce significant noise contamination into the processed image. A key condition for the combined data channels to best contribute to conventional parallel imaging is if they have distinctly different sensitivity profiles. The degree to which these sensitivity profiles are not distinct, and with particular reference to how noise is sampled at each spatial location by each coil element 20, is encapsulated in the term commonly called the "g-factor" or "goodness factor". In approaches such as SMASH and SENSE, the g-factor modifies the SNR equation to $$SNR(reduced\ scan) = SNR(full\ scan)/[g \cdot \sqrt{(R)}]$$

Thus, for regions of the image where g is significantly greater than 1, the SNR of that region is noticeably reduced. The g-factor varies over the whole of the imaged volume, and is dependant on multiple factors. However, it is typical for the g-factor to reach an elevated average value of about 1.2 or higher close to the center of the imaged volume. Further, this central region is typically imaged at a lower SNR compared to the periphery of the body by a factor of about 5:1 (depending on coil element 20 size and body region being imaged). Thus, the central region of the image is typically compromised in SNR even in a full scan, and the additional reduction in SNR resulting from elevation of the g-factor typically makes the increase in noise very noticeable. In the current invention, since only one coil is involved in the primary processing routine, the effective g-factor approaches 1. In cardiac imaging in particular, the central region of the image typically contains the heart and vasculature, and thus imaging this region with good SNR often imposes a limiting factor on the acceptable image quality. The higher performance in this region will make the current invention desirable.

In prior approaches that do not use the parallel imaging approaches to reconstruct images from a reduced k-space data set, such as Reduced Field of View imaging, there is an assumption that half of the field of view is occupied by static tissue, and that this static tissue signal can be removed by a post-processing step or steps. While the current invention is expected to perform optimally when this condition is met, this is not a strict requirement for the current invention. The current invention has several advantages:

1) In the prior approaches, a data subtraction operation is performed, and this is an inherently noise amplifying operation, the SNR produced in the final image is lower than the theoretical limit of by a factor of the square root of A $$SNR(reduced\ scan) = SNR(full\ scan)/\sqrt{(R \cdot A)}$$

In the subtraction process, the factor A approaches 2. In the current invention, the folded over data is removed by a multiplication operation, since the ratio of sensitivity between one pixel and the corresponding folded over pixel is used to assign pixel intensity. Since the operation of multiplication does not propagate noise to the extent that subtraction does, the SNR of the final unfolded image approaches the theoretical limit governed by the sparse sampling factor, i.e. the additional noise factor, A, approaches 1.

2) Under conditions that the subtracted signal is not truly static (e.g. slowly varying due to breathing or cardiac tethering), then additional artifacts are introduced due to signal misregistration. Additionally, there is typically a constraint that the static region is contagious. In the current invention, there is no restriction that the body remains in a static configuration.

3) Approaches such as UNFOLD were introduced to deal with the removal of image data originating from regions that are not truly static. (Madore B M, Glover G H, Pelc N J. Unaliasing by Fourier encoding the overlaps using the temporal dimension (UNFOLD), applied to cardiac imaging and fMRI. Magn Reson Med 1999; 42:813-828, incorporated by reference herein.) In these approaches, the unfolding operation is performed using temporally close data sets. In effect, these approaches acquire interleaved sparse sampled data (e.g. odd lines are acquired at time point one, even lines are acquired at time point two) and the close proximity of the interleaved data is used to reduce the degree of the slowly varying close to static component. However, while these approaches reduce the subtraction error of image regions that are not truly static, they necessarily introduce temporal blur into the primary dynamic features of the image (since data are combined from two or more adjacent time points). In the current invention, the information required to remove folded over image regions uses the ratio map from opposite halves of an individual coil element 20. Since this ratio map is static, and independent of temporal changes that occur in the body, the unfolded images are not temporally averaged or distorted.

EXAMPLE

The Single Coil Parallel Imaging apparatus 10 involves an acquisition and a processing stage. The acquisition involves acquiring alternate lines of k-space over a time resolved series, e.g. in cardiac imaging, the time dimension represents time over the cardiac cycle. FIGS. 7A-7C show a schematic of one possible manner in which MRI k-space data can be acquired for the Single Coil Parallel Imaging invention. FIG. 7A represents the fully sampled k-space series (i.e. each k-space data set would generate an un-folded over image). FIG. 7C represents where images are to be represented throughout the cardiac cycle, i.e. equally distributed from the start of the cardiac cycle to the end in this example. FIG. 7B represents how the sparsely sampled k-space matrix data are acquired at each point in the cardiac cycle: from the start of the cycle to the penultimate frame, alternate lines of k-space are sampled (e.g. every even line), while for the last frame, alternate lines are sampled, but in this case correspond to the series of lines omitted in the previous frames (e.g. every odd line). In this example, the majority of the cardiac phases have only the even k-space lines acquired, and the very last time frame has the odd lines of k-space acquired. This example is illustrative of the condition where high temporal resolution is not desired at the end of the cycle (e.g. it is geared towards higher resolution over systole and the beginning of diastole, other variations are possible.

The last two time frames are combined such that a fully resolved k-space data set is formed, i.e. data from two successive time frames are combined to form a fully resolved image, FIG. 2. In practice there is a fully formed image for each of the separate coil elements 20. Consider the case where we have two coil elements 20, one positioned on the right hand side (RHS) of the body and one on the left hand side (LHS). FIG. 8 shows the last two frames of the acquired k-space data are combined such that the even and odd lines of k-space are correctly positioned in the matrix, and the image produced by Fourier transformation represents a fully resolve, i.e. not folded over, image, represented by the circular feature here. Also illustrated here are two representative coil elements 20, one located on the right hand side of the body (RHS) and one on the left hand side (LHS).

Figure 9:
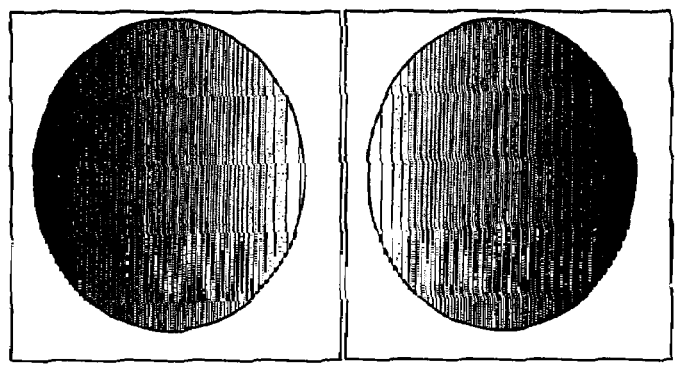
FIG. 9 shows the single frame of the fully resolved image is imaged at different intensities from each of the receiver coil elements.

The intensity variations across the image are dependent on which coil element 20 is used to form that particular image, e.g. the LHS coil has a higher intensity on the LHS of the image, and the RHS coil has a higher intensity on the RHS of the image. FIG. 9 shows the single frame of the fully resolved image is imaged at different intensities from each of the receiver coil elements 20. Illustrated here for two coil elements 20 positioned on diametrically opposite sides of the body, where for the coil element 20 on the left hand side, the left hand section of the body is imaged with increased intensity (represented by darker shading in the first panel). For the coil element 20 on the right hand side, the right hand section of the body is imaged with increased intensity (represented by darker shading in the second panel).

Figure 10:
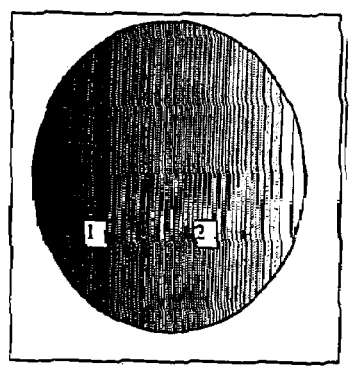
FIG. 10 shows, for the single frame of the fully resolved image for each coil element the ratio map is formed from pixels that would overlap in a folded over image.

For each of the coil elements 20 separately, the ratio map is formed using the fully resolved image. The ratio map corresponds to the intensity ratio of pixels that would overlap in a 50% folded over image. FIG. 10 shows, for the single frame of the fully resolved image for each coil element 20 (shown here for the coil element 20 on the left hand side of the object) the ratio map is formed from pixels that would overlap in a folded over image, e.g. for pixel 1 and pixel 2 the ratio of pixel intensities is formed. For this coil element 20, the ratio operation is performed for all corresponding pixels and stored in a matrix. A separate ratio map is formed for each unfolded over image for each coil element 20. The ratio map only has to occupy half of the image matrix, since it incorporates number from each half of the image.

Figure 12:
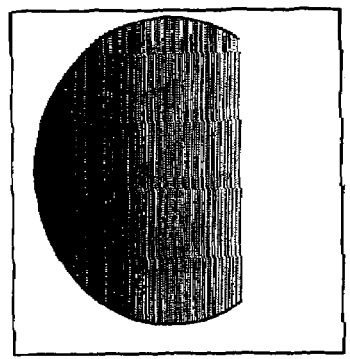
FIG. 12 shows, for each coil element, the unfolding operation works best for the pixels closest to the coil location.
Figure 11:
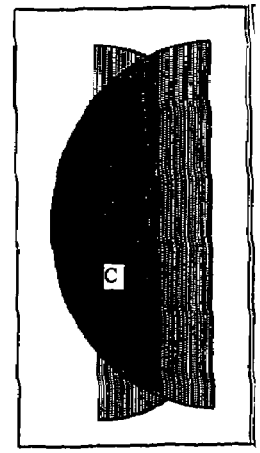
FIG. 11 shows from each of the folded over images for one particular coil element.

For each coil element 20, folded over images are formed from the k-space lines sampled at alternate time points, FIG. 5. Each pixel contains contributions from two overlapping pixels, the position of each pixel is known from simple geometric considerations already used to form the ratio map. The ratio map information is used to distribute the pixel intensity between the two pixels, one pixel closest to the coil element 20 and one pixel more remote from the coil element 20. FIG. 11 shows from each of the folded over images for one particular coil element 20 (e.g. the left hand coil element 20 in this case), Fourier transform of the k-space matrix results in an image with 50% folded over pixels as indicated. For each pixel, the observed intensity (e.g. C) represents the contribution from the pixel nearest the coil element 20 (e.g. 1 in FIG. 10), and the corresponding pixel furthest from the coil element 20 (e.g. 2 in FIG. 10). The composite pixel is split between the two unfolded over pixel positions according to the following formula:

Closest pixel intensity=$R \times C/(R+1)$

Where R is the ratio value and C is the observed intensity in the folded over image Furthest pixel intensity=$C-$Closest pixel intensity The unfolding operation generally fails to yield good data in the pixels most remote from the coil. FIG. 12 shows, for each coil element 20, the unfolding operation works best for the pixels closest to the coil location (e.g. left hand location in this example). The pixels furthest from the coil are relatively poorly represented, since they are remote from the coil and are thus acquired at low signal to noise ratio. In this case, these pixels can be set to zero. In this FIG. 12, these pixels can be set to zero. This is not considered a major limitation, since these pixels are poorly seen even in a fully resolved image, and would typically not be examined using that remote coil element 20.

The unfolding operation can be performed separately for images obtained from each coil element 20. FIG. 13 shows a separate folded over image is available from each coil element 20. In this example, the coil element 20 is located on the right hand side of the body. A ratio map for this coil element 20 is formed as for the other coil elements, and folded over pixel elements are assigned to positions closer of further from the coil as for all other coil elements.

The separate unfolded images can be combined at the final stage to produce an image with conventional appearance. The operation of combining images is illustrated in FIG. 14. FIG. 14 shows, for opposite coil elements, the unfolded images have opposite edges set to zero. To combine the images into a single composite image, the data are combined as follows: in regions where pixels with non-zero values overlap, the composite pixel is set to the square root of the sum of the squares of the individual pixels; in pixels where only one coil element 20 contributes, the pixel is set to the value of that one coil element 20.

Nyquist Sampling Criteria

The density with which k-space has to be sampled without introducing signal aliasing is governed by the Nyquist sampling criteria. In MRI, the inter-sample separation along the line direction ($\Delta K$) has to exceed or match the Nyquist sample criteria given by:

Field of View=$2 \times \Pi / \Delta K$

FIG. 14 illustrates that the separation of k-space lines satisfying the Nyquist criteria. FIG. 15 shows a schematic of the density of sampling of k-space lines that satisfy the Nyquist sampling criteria. In this case, Fourier transformation of the k-space data will yield an image without signal aliasing.

To demonstrate how the invention works, data were acquired on a commercial MRI system 12 (General Electric, Excite HD, 1.5 Tesla). When implemented, the invention will be applied to acquired data in the specified manner on an otherwise standard MRI system 12, and process the data in the specified manner. The invention is not restricted to the type of imaging sequence used for the time resolved acquisition.

In the MRI system 12, a channel represents the combination of receiver coil element 20 signal reception, signal amplification, digitization, filtering, and storage of data in the computer 14 system 12. After the technique described herein has been applied to acquire and process the data from each channel into individual images, corresponding images from each channel can be combined into a composite image. The combination process is not critical, but can be taking the square root of the sum of the squares of individual pixels. FIG. 6 is a block diagram of self-referencing process.

Although the invention has been described in detail in the foregoing embodiments for the purpose of illustration, it is to be understood that such detail is solely for that purpose and that variations can be made therein by those skilled in the art without departing from the spirit and scope of the invention except as it may be described by the following claims.

The invention claimed is:

1. An imaging apparatus for an object in change comprising:
    a magnetic resonance imaging (MRI) system having a computer, and a plurality of channels which produce corresponding images of the object in change using alternate lines of k-space, the computer combining the individual images into a composite image of the object, the MRI system acquiring alternate lines of temporally resolved data,
    wherein the MRI system requires at least one frame of temporally resolved data at full resolution acquired over two time frames,
    wherein each channel includes a coil element and a signal receiver that retains image data corresponding to a region of the object closest to the coil element, wherein the region includes at least 50% of the data,
    wherein the individual image from each coil element is imaged at different intensities to form a fully resolved image, and
    wherein the computer forms a ratio map for each channel separately using the corresponding fully resolved image.

2. An apparatus as described in claim 1 wherein the ratio map for an individual channel corresponds to an intensity ratio of pixels that would overlap in an approximately 50% folded over image.

3. An apparatus as described in claim 2 wherein the computer uses the ratio map to distribute pixel intensity between a first pixel closest to the coil and a second pixel more remote to the coil than the first pixel.

4. An apparatus as described in claim 3 wherein the composite pixel is split between two unfolded pixel positions according to the formula closest pixel intensity=$R \times C/(R+1)$ where R is the ratio value and C is the observed intensity in the folded over image, and furthest pixel intensity=$C$−closest pixel intensity.

5. An apparatus as described in claim 4 wherein the computer forms the composite image by setting pixels of the individual image of a first channel with no overlap with the individual image of a second channel to the value of the pixel of the first individual image.

6. An apparatus as described in claim 5 wherein the computer forms the composite image with composite pixels with non-zero values of the individual images that overlap equal to the square root of the sum of the squares of the individual pixels which overlap.

7. A method for imaging an object in change, the method comprising:
producing a first individual image of the object in change with a first channel of an MRI system using alternate lines of k-space, wherein the first channel comprises a coil element and a signal receiver, wherein said producing comprises acquiring at least one frame of temporally resolved data at full resolution over two time frames and imaging the first individual image with the coil element at different intensities;
producing at least one second individual image of the object in change with a second channel of the MRI system independent of the first channel by acquiring alternate lines of temporally resolved data using alternate lines of k-space, wherein each second channel comprises a coil element and a signal receiver;
combining, by a computer of the MRI system, the first individual image and the at least one second individual image into a composite image of the object;
retaining image data corresponding to a region closest to each coil element, wherein the region for each channel includes at least 50% of the data; and
forming a ratio map for each channel separately using the corresponding fully resolved image with the computer.

8. A method as described in claim 7 wherein the ratio map forming step includes the stop of forming the ratio map for an individual channel corresponding to an intensity ratio of pixels that would overlap in an approximately 50% folded over image.

9. An apparatus as described in claim 1 wherein the two time frames are consecutive.

10. An apparatus as described in claim 1 wherein the two time frames are temporally distributed.

11. A method as described in claim 7 wherein the two time frames are consecutive.

12. A method as described in claim 7 wherein the two time frames are temporally distributed.

* * * * *